(12) United States Patent
Kaneda

(10) Patent No.: US 7,510,815 B2
(45) Date of Patent: Mar. 31, 2009

(54) REMOVING SOLUTION FOR PHOTOSENSITIVE COMPOSITION

(75) Inventor: Masato Kaneda, Shunan (JP)

(73) Assignee: Showa Denko K.K., Tokyo (JP)

( * ) Notice: Subject to any disclaimer, the term of this patent is extended or adjusted under 35 U.S.C. 154(b) by 75 days.

(21) Appl. No.: 10/592,119

(22) PCT Filed: Feb. 9, 2006

(86) PCT No.: PCT/JP2006/002678

§ 371 (c)(1),
(2), (4) Date: Sep. 8, 2006

(87) PCT Pub. No.: WO2006/085681

PCT Pub. Date: Aug. 17, 2006

(65) Prior Publication Data

US 2007/0196775 A1  Aug. 23, 2007

(30) Foreign Application Priority Data

Feb. 9, 2005 (JP) .............................. 2005-032732

(51) Int. Cl.
*G03C 1/492* (2006.01)
*G03C 5/00* (2006.01)

(52) U.S. Cl. ..................................... 430/269; 430/331

(58) Field of Classification Search ................. 430/269, 430/331

See application file for complete search history.

(56) References Cited

U.S. PATENT DOCUMENTS

2007/0161530 A1 *  7/2007  Kaneda et al. .............. 510/176

FOREIGN PATENT DOCUMENTS

| JP | 7-128867 A | 5/1995 |
|---|---|---|
| JP | 7-160008 A | 6/1995 |
| JP | 11-44960 A | 2/1999 |
| JP | 2000-164671 A | 6/2000 |
| JP | 2000-204302 A | 7/2000 |
| JP | 2002-501105 A | 1/2002 |
| JP | 2002-341130 A | 11/2002 |
| JP | 2003-167114 A | 6/2003 |
| JP | 2005-128529 A | 5/2005 |

* cited by examiner

*Primary Examiner*—Geraldina Visconti
(74) *Attorney, Agent, or Firm*—Sughrue Mion, PLLC

(57) ABSTRACT

A removing solution for photosensitive composition for removal of colored pigment-containing photosensitive compositions, comprising at least one solvent selected from the group consisting of alkylene glycol monoalkyl ether carboxylic acid esters, alkoxycarboxylic acid esters and alicyclic ketones, at least one solvent selected from the group consisting of linear amides, cyclic amides, sulfur-containing compounds and cyclic esters, and if desired an aromatic hydrocarbon having 9 or more carbon atoms. The removing solution for photosensitive composition exhibits excellent photosensitive composition removing performance.

17 Claims, No Drawings

REMOVING SOLUTION FOR PHOTOSENSITIVE COMPOSITION

TECHNICAL FIELD

The present invention relates to a removing solution for photosensitive composition. In particular, the invention relates to a removing solution for the removal of an uncured photosensitive composition film coated on the periphery, edges or back side of a substrate or for removal of an uncured photosensitive composition attached to the surface of an apparatus member or an equipment, during the step of forming a photosensitive composition film on a glass substrate, semiconductor wafer or the like.

The removing solution for photosensitive composition of the invention is particularly useful for removal of a residual uncured pigment-containing photosensitive composition film on the periphery, edges or back side of a substrate or for removal of an uncured pigment-containing photosensitive composition attached to the surface of an apparatus member or an equipment, in the step of forming a photosensitive composition film coated on the substrate for the manufacture of a color filter used for a liquid crystal device, an organic EL device or an image sensor.

BACKGROUND ART

Photosensitive composition patterns are ordinarily formed using lithographic techniques in manufacturing processes for flat panel displays such as liquid crystal devices, organic EL devices or plasma displays or for semiconductors.

RGB or resin black matrix pattern forming methods used for manufacture of color filters used in liquid crystal devices, organic EL devices and image sensors include pigment dispersion methods, dyeing methods, printing methods and electrodeposition methods. Pigment dispersion methods accomplish patterning of different colors by photolithography using a photosensitive composition containing a pigment, and because they yield stable colored films they are suitable for the manufacture of color filters. When a photosensitive composition film is formed on a substrate by such a method, a process of coating the pigment-containing photosensitive composition onto the substrate is included, and known coating methods therefor include spin coating, slit coating, wire bar coating, roll coating, dip coating, spray coating and combinations of these.

In the case of spin coating, removal of swelling portions of the photosensitive composition film on the periphery or edges of the substrate after coating of the photosensitive composition, or removal of the photosensitive composition attached to the back side thereof, is usually accomplished by rinsing treatment with a removing solution for photosensitive composition, known as edge rinsing or back rinsing. Photosensitive composition removal with a removing solution for photosensitive composition is also carried out in so-called cup rinsing, which is a step of removing the photosensitive composition that has splashed out into a coater-cup.

The coating process for the photosensitive composition during the manufacture of a color filter may be application of the photosensitive composition by slit coating, application using a wire bar, or application with a roll coater, instead of the aforementioned spin coating, but in all of these methods the application of the photosensitive composition is followed by removal of the unnecessary photosensitive composition attached to all or portions of the coating apparatus, such as the slit nozzle or the wire bar.

In addition, it is also sometimes necessary to remove the photosensitive composition attached to members of the coating apparatus, such as apparatus tubes used for transport of the photosensitive composition. In most cases, removal of the photosensitive composition is accomplished by cleaning with a removing solution.

Residue of the photosensitive composition components is a problem in all removal steps for photosensitive compositions attached to such substrates or apparatuses. Pigment-containing photosensitive compositions used in the manufacture of color filters, i.e., color resists used for RGB formation or black resists used for resin black matrix formation, tend to leave residues of the pigment components on the substrate or apparatus surfaces, and even when present in small amounts these constitute foreign inclusions which cause increase of the defect ratio in color filter manufacturing or color purity degradation or reduced contrast of the color filter. With the increasing requirements for larger sizes, higher precision and lower cost of color filters used in color displays in recent years, it is becoming even more important to avoid photosensitive composition component residue that can affect the performance and yield of the color filters.

Conventional photosensitive composition removing agents are generally glycol ethers or their esters or mixtures thereof (for example, see Japanese Examined Patent Publication No. 4-49938), but when these are applied for cleaning and removal of the aforementioned color resists, the resist-removing property is inadequate and the removing solution must be used in a large amount, also resulting in production of removal residue.

Pigment-containing coloring compositions are also removed by methods employing solvent components used in photosensitive compositions or components contained in photosensitive compositions such as surfactants or dispersing agents (for example, see Japanese Unexamined Patent Publication No. 2000-273370), but when solvent components in photosensitive compositions are used alone as the cleaning agents, the pigments tend to precipitate and an adequate cleaning effect cannot be achieved. In addition, when components contained in photosensitive compositions, such as surfactants or dispersing agents, are added to cleaning solution compositions, the components tend to remain as vaporization residue on substrates or apparatus members, thus requiring a further cleaning step, and they essentially cannot be used for removal of the photosensitive composition from the edges or back sides of substrates which ideally should not have vaporization residue.

DISCLOSURE OF THE INVENTION

It is an object of the present invention to provide a removing solution for photosensitive composition with an excellent ability to remove photosensitive compositions.

The invention provides, in particular, a removing solution which is effective for removal of a residual pigment-containing photosensitive composition film coated on the periphery, edges or back side of a substrate or for removal of a pigment-containing photosensitive composition attached to the surface of an apparatus member or an equipment, during the step of forming a photosensitive composition film on a liquid crystal device, an organic EL device, an image sensor or the like.

In some parts of the present specification, "component 1" will refer to at least one solvent selected from the group consisting of alkylene glycol monoalkyl ether carboxylic acid esters, alkoxycarboxylic acid esters and alicyclic ketones, "component 2" will refer to at least one solvent selected from the group consisting of linear amides, cyclic amides, sulfur-containing compounds and cyclic esters, and "component 3" will refer to an aromatic hydrocarbon having 9 or more carbon atoms.

The present inventors have conducted much diligent research aimed at overcoming the aforementioned problems. As a result, it was discovered that the ability to clean and remove pigment-containing photosensitive compositions is improved by using a removal solution having a specified composition, and the present invention has thereupon been completed.

Specifically, the invention comprises the following aspects.

[1] A removing solution for photosensitive composition which is a removing solution for a colored photosensitive composition containing a pigment, comprising (1) 99-70 mass % of at least one solvent selected from the group consisting of alkylene glycol monoalkyl ether carboxylic acid esters, alkoxycarboxylic acid esters and alicyclic ketones, and (2) 1-30 mass % of at least one solvent selected from the group consisting of linear amides, cyclic amides, sulfur-containing compounds and cyclic esters.

[2] A removing solution for photosensitive composition which is a removing solution for a colored photosensitive composition containing a pigment, comprising (1) 98-40 mass % of at least one solvent selected from the group consisting of alkylene glycol monoalkyl ether carboxylic acid esters, alkoxycarboxylic acid esters and alicyclic ketones, (2) 1-30 mass % of at least one solvent selected from the group consisting of linear amides, cyclic amides, sulfur-containing compounds and cyclic esters, and (3) up to 50 mass % of an aromatic hydrocarbon having 9 or more carbon atoms.

[3] A removing solution for photosensitive composition which is a removing solution for a red photosensitive composition containing a pigment, comprising (1) 99-80 mass % of at least one solvent selected from the group consisting of alkylene glycol monoalkyl ether carboxylic acid esters, alkoxycarboxylic acid esters and alicyclic ketones, and (2) 1-20 mass % of at least one solvent selected from the group consisting of linear amides, cyclic amides, sulfur-containing compounds and cyclic esters.

[4] A removing solution for photosensitive composition which is a removing solution for a red photosensitive composition containing a pigment, comprising (1) 98-50 mass % of at least one solvent selected from the group consisting of alkylene glycol monoalkyl ether carboxylic acid esters, alkoxycarboxylic acid esters and alicyclic ketones, (2) 1-20 mass % of at least one solvent selected from the group consisting of linear amides, cyclic amides, sulfur-containing compounds and cyclic esters, and (3) up to 30 mass % of a C9 or greater aromatic hydrocarbon.

[5] A removing solution for photosensitive composition which is a removing solution for a green, blue or black photosensitive composition containing a pigment, comprising (1) 95-70 mass % of at least one solvent selected from the group consisting of alkylene glycol monoalkyl ether carboxylic acid esters, alkoxycarboxylic acid esters and alicyclic ketones, and (2) 5-30 mass % of at least one solvent selected from the group consisting of linear amides, cyclic amides, sulfur-containing compounds and cyclic esters.

[6] A removing solution for photosensitive composition which is a removing solution for a green, blue or black photosensitive composition containing a pigment, comprising (1) 94-40 mass % of at least one solvent selected from the group consisting of alkylene glycol monoalkyl ether carboxylic acid esters, alkoxycarboxylic acid esters and alicyclic ketones, (2) 5-30 mass % of at least one solvent selected from the group consisting of linear amides, cyclic amides, sulfur-containing compounds and cyclic esters, and (3) up to 30 mass % of an aromatic hydrocarbon having 9 or more carbon atoms.

[7] A removing solution for photosensitive composition according to [2], [4] or [6] above, wherein the aromatic hydrocarbon having 9 or more carbon atoms is an alkylbenzene with a boiling point of 150-250° C.

[8] A removing solution for photosensitive composition according to any one of [1] to [7] above, wherein at least one solvent selected from the group consisting of linear amides, cyclic amides, sulfur-containing compounds and cyclic esters is at least one compound selected from the group consisting of N,N-dimethylformamide, N,N-dimethylacetamide, N-methylpyrrolidone, dimethylsulfoxide and γbutyrolactone.

[9] A removing solution for photosensitive composition according to any one of [1] to [8], wherein the alkylene glycol monoalkyl ether carboxylic acid ester is at least one compound selected from the group consisting of propylene glycol monomethyl ether acetate and 3-methoxybutyl acetate.

[10] A removing solution for photosensitive composition according to any one of [1] to [8], wherein the alkoxycarboxylic acid ester is at least one compound selected from the group consisting of methyl 3-methoxypropionate and ethyl 3-ethoxypropionate.

[11] A removing solution for photosensitive composition according to any one of [1] to [8] above, wherein the alicyclic ketone is at least one compound selected from the group consisting of cyclohexanone, cyclopentanone and methylcyclohexanone.

[12] A removing solution for photosensitive composition according to any one of [1] to [11] above, which is used for removal of an acrylic photosensitive composition containing a colored pigment.

[13] A removing solution for photosensitive composition according to any one of [1] to [12] above, which is used for removal of a photosensitive composition containing a pigment prior to exposure to light.

[14] An apparatus in which a photosensitive composition containing a colored pigment is removed using a removing solution for photosensitive composition according to any one of [1] to [13] above.

[15] A color filter obtained by an apparatus according to [14] above.

[16] A device equipped with a color filter according to [15] above.

[17] A substrate that has been treated for removal of a photosensitive composition containing a colored pigment using a removing solution for photosensitive composition according to any one of [1] to [13] above.

The removing solution for photosensitive composition of the invention can be effectively used for removal of a residual pigment-containing photosensitive composition film coated on the periphery, edges or back side of a substrate or for removal of a pigment-containing photosensitive composition attached to the surface of an apparatus member or an equipment, during the step of forming a photosensitive composition film on a liquid crystal device, an organic EL device, an image sensor or the like.

BEST MODE FOR CARRYING OUT THE INVENTION

Preferred modes of the removing solution for photosensitive composition of the invention will now be explained.

The removing solution for photosensitive composition of the invention (hereinafter also referred to simply as "removing solution") is used for removal of pigment-containing colored photosensitive compositions, and it comprises at least one solvent selected from the group consisting of alkylene glycol monoalkyl ether carboxylic acid esters, alkoxycarboxylic acid esters and alicyclic ketones (component 1), and at least one solvent selected from the group consisting of linear amides, cyclic amides, sulfur-containing compounds and cyclic esters (component 2).

The alkylene glycol monoalkyl ether carboxylic acid ester, alkoxycarboxylic acid ester and alicyclic ketone (component 1) used for the invention are preferably used as the major component of the removing solution for photosensitive composition, because of the high solubility of the resin component in the photosensitive composition. As specific examples for component 1 there may be mentioned ethylene glycol monomethyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, propylene glycol monomethyl ether acetate, dipropylene glycol monomethyl ether acetate, 3-methoxybutyl acetate and 3-methyl-3-methoxybutyl acetate as alkylene glycol monoalkyl ether carboxylic acid esters; methyl 2-methoxyacetate, ethyl 2-ethoxyacetate, ethyl 3-ethoxypropionate, methyl 3-methoxypropionate, ethyl 3-methoxypropionate, methyl 3-ethoxypropionate, ethyl 2-methoxypropionate, propyl 2-ethoxypropionate, methyl 2-ethoxypropionate, ethyl 2-ethoxypropionate and methyl β-methoxyisobutyrate as alkoxycarboxylic acid esters; and cyclohexanone, cyclopentanone and methylcyclohexanone as alicyclic ketones, although the invention is not limited to these.

Among these, propylene glycol monomethyl ether acetate, methyl 3-methoxypropionate, ethyl 3-ethoxypropionate, cyclohexanone and cyclopentanone are particularly preferred from the standpoint of easier removability of the photosensitive composition, ready availability and safety. The alkylene glycol monoalkyl ether carboxylic acid ester, alkoxycarboxylic acid ester and alicyclic ketone in the removing solution of the invention may be of single types or a combination of two or more types.

The one or more solvents selected from the group consisting of linear amides, cyclic amides, sulfur-containing compounds and cyclic esters (component 2) are effective for further improving the removing performance of the removing solution for photosensitive composition, or in other words, the solubility of the resin component and the pigment removing performance. As specific examples there may be mentioned formamide, N-methylformamide, N,N-dimethylformamide, N-ethylformamide, N, N-diethylformamide, N, N-dimethylacetamide and tetramethylurea as linear amides; N-methyl-2-pyrrolidone and N-methylimidazolidinone as cyclic amides; dimethylsulfoxide and sulfolane as sulfur-containing compounds; and γbutyrolactone as a cyclic ester, although the invention is not limited to these.

Among these, N,N-dimethylformamide, N,N-dimethylacetamide, N-methyl-2-pyrrolidone, dimethylsulfoxide and γbutyrolactone are preferred from the standpoint of increasing the solubility and removing property of the photosensitive composition. Component 2 in the removing solution of the invention may be of a single type, or a combination of two or more types may be used.

The preferred proportion of component 1 and component 2 is 99-70 mass % of component 1 and 1-30 mass % of component 2.

Component 2 is added to the removing solution for photosensitive composition of the invention for the purpose of further improving the photosensitive composition removing performance of component 1, and when it is a red photosensitive composition containing a pigment, for example, an anthraquinone-based pigment such as C.I. Pigment Red 177 or a diketopyrrolopyrrole-based pigment such as C.I. Pigment Red 254, component 2 in the removing solution for photosensitive composition of the invention exhibits an effect of improving the removing performance if present at 1 mass % or greater. In the case of a pigment-containing red photosensitive composition, the removing solution composition most preferably contains component 1 in a range of 99-80% and component 2 in a range of 1-20 mass %. These ranges are preferred to increase the cleaning performance of the removing solution for photosensitive composition of the invention for red photosensitive compositions, and to prevent aggregation and precipitation of the red pigment.

In the case of a green, blue or black photosensitive composition containing a pigment, for example, a phthalocyanine-based pigment such as C.I. Pigment Blue 15, 15:1, 15:4, 15:6, C.I. Pigment Green 36 or carbon black, component 2 in the photosensitive composition of the invention exhibits an effect of improving the removing performance if present at 5% or greater. For a green, blue or black photosensitive composition, a removing solution composition containing component 1 in a range of 95-70 mass % and component 2 in a range of 5-30 mass % is preferred to exhibit a particularly notable effect and to prevent aggregation and precipitation of the pigment.

In addition to at least one solvent selected from the group consisting of alkylene glycol monoalkyl ether carboxylic acid esters, alkoxycarboxylic acid esters and alicyclic ketones (component 1), at least one solvent selected from the group consisting of linear amides, cyclic amides, sulfur-containing compounds and cyclic esters (component 2), the removing solution of the invention may also contain an aromatic hydrocarbon having 9 or more carbon atoms (component 3) in an amount of up to 50 mass % to further enhance removability of the pigment in the photosensitive composition.

The C9 or greater aromatic hydrocarbon (component 3) according to the invention is preferably an alkyl-substituted aromatic hydrocarbon, and there may be mentioned alkylbenzenes and alkylnaphthalenes. The alkyl group may be straight-chain or branched, or two or more groups may be linked to form a cyclic structure. The number of carbon atoms of the aromatic hydrocarbon is at least 9 but is preferably no greater than 12. As specific examples for component 3 there may be mentioned alkylbenzenes such as 1,2,3-trimethylbenzene, 1,2,4-trimethylbenzene, 1,3,5-trimethylbenzene, 1-ethyl-2-methylbenzene, 1-ethyl-3-methylbenzene, 1-ethyl-4-methylbenzene, n-propylbenzene, cumene, n-butylbenzene, sec-butylbenzene, iso-butylbenzene, 1,2,3,4-tetramethylbenzene, 1,2,3,5-tetramethylbenzene, 1,2,4,5-tetramethylbenzene, 1,2-dimethyl-3-ethylbenzene, 1,2-dimethyl-4-ethylbenzene, 1,3-dimethyl-2-ethylbenzene, 1,3-dimethyl-4-ethylbenzene, 1,3-dimethyl-5-ethylbenzene, 1,4-dimethyl-2-ethylbenzene, 1-methyl-2-propylbenzene, 1-methyl-3-propylbenzene, 1-methyl-4-propylbenzene, 1-methyl-2-isopropylbenzene, 1-methyl-3-isopropylbenzene, 1-methyl-4-isopropylbenzene, 1,2-diethylbenzene, 1,3-diethylbenzene, 1,4-diethylbenzene, pentylbenzene, methylbutylbenzene, ethylpropylbenzene, dimethylpropylbenzene, methyldiethylbenzene, trimethylethylbenzene, pentamethylbenzene, hexylbenzene, methylpentylbenzene, ethylbutylbenzene, dimethylbutylbenzene, dipropylbenzene, methylethylpropylbenzene, trimethylpropylbenzene, triethylbenzene, dimethyldiethylbenzene, tetramethylethylbenzene, hexamethylbenzene, indane and tetrahydronaphthalene, and alkylnaphthalenes such as methylnaphthalene and dimethylnaphthalene, although the invention is not limited to these.

These aromatic hydrocarbons may be used alone in the removing solution for photosensitive composition of the invention, or combinations of two or more of them may be used.

Preferred among these are alkylbenzenes with boiling points of 150-250° C., from the standpoint of removing performance of photosensitive compositions, and especially high removing performance of pigment-containing photosensitive compositions, as well as drying performance suitable for removal of photosensitive compositions.

Particularly preferred alkylbenzenes among those mentioned above include C9 or C10 alkylbenzenes, of which specific examples include 1,2,3-trimethylbenzene, 1,2,4-trimethylbenzene, 1,3,5-trimethylbenzene, 1-ethyl-2-methylbenzene, 1-ethyl-3-methylbenzene, 1-ethyl-4-methylbenzene, n-propylbenzene, cumene, n-butylbenzene, sec-butylbenzene, iso-butylbenzene, 1,2,3,4-tetramethylbenzene, 1,2,3,5-tetramethylbenzene, 1,2,4,5-tetramethylbenzene, 1,2-dimethyl-3-ethylbenzene, 1,2-dimethyl-4-ethylbenzene, 1,3-dimethyl-2-ethylbenzene, 1,3-dimethyl-4-ethylbenzene, 1,3-dimethyl-5-ethylbenzene, 1,4-dimethyl-2-ethylbenzene, 1-methyl-2-propylbenzene, 1-methyl-3-propylbenzene, 1-methyl-4-propylbenzene, 1-methyl-2-isopropylbenzene, 1-methyl-3-isopropylbenzene, 1-methyl-4-isopropylbenzene, 1,2-diethylbenzene, 1,3-diethylbenzene and 1,4-diethylbenzene.

For actual use of the removing solution of the invention, the aromatic hydrocarbon may be one prepared by any desired method, but it is effective to use a solvent naphtha with a high aromatic component ratio, for example, a primarily C9 alkylbenzene mixed solvent, and for a removing solution of the invention it is suitable to use a mixture of aromatic hydrocarbons such as Shellsol A (trade name of Shell Chemicals Japan Ltd. initial boiling-point (IBP): 160° C., dry point: 182° C.), Solvesso 100 (trade name of Exxon Mobil Chemical Co., IBP: 164° C., dry point: 176° C.), Swasol 1000 (trade name of Maruzen Petrochemical Co., Ltd. IBP: 161° C., dry point: 179° C.), Ipusol 100 (trade name of Idemitsu Kosan Co., Ltd. IBP: 162° C., dry point: 179° C.), Hisol 100 (trade name of Nippon Oil Corporation. IBP: 155° C., dry point: 180° C.), Solfine-TM (trade name of Showa Denko K.K. IBP: 160° C., dry point: 180° C.), a primarily C10 alkylbenzene-based mixed solvent such as Shellsol AB (trade name of Shell Chemicals Japan Ltd. IBP: 187° C., dry point: 213° C.), Solvesso 150 (trade name of Exxon Mobil Chemical Co., IBP: 188° C., dry point: 209° C.), Swasolve 1500 (trade name of Maruzen Petrochemical Co., Ltd. IBP: 180.5° C., dry point: 208.5° C.), Ipusol 150 (trade name of Idemitsu Kosan Co., Ltd. IBP: 186° C., dry point: 205° C.), Hisol 150 (trade name of Nippon Oil Corporation. IBP: 182° C., dry point: 216° C.), Solfine-WZ (trade name of Showa Denko K.K. IBP: 195° C., dry point: 250° C.), and a primarily C10 alkylbenzene-alkylnaphthalene-based mixed solvent such as Swasol 1800 (trade name of Maruzen Petrochemical Co., Ltd. IBP: 195.5° C., dry point: 245° C.).

Component 3 is added with component 1 and component 2 of the removing solution for photosensitive composition of the invention for the purpose of maintaining dispersion of the pigment and further enhancing the photosensitive composition removing performance.

When the removing solution for photosensitive composition of the invention comprises component 1, component 2 and component 3, the preferred proportions for component 1, component 2 and component 3 are 98-40% of component 1, 1-30% of component 2 and up to 30% of component 3.

A component 3 content of no greater than 30% is preferred to further increase the removing performance for the pigment in the photosensitive composition without lowering the dissolving performance of the resin component in the photosensitive composition.

When the removing solution for photosensitive composition of the invention containing component 1, component 2 and component 3 is used for removal of a red photosensitive composition containing an anthraquinone-based pigment such as C.I. Pigment Red 177 or a diketopyrrolopyrrole-based pigment such as C.I. Pigment Red 254, an effect of improved removing performance will be exhibited if the content of component 2 is 1% or greater and the content of component 3 is up to 30% in the removing solution for photosensitive composition of the invention. That is, in the case of removing a pigment-containing red photosensitive composition, the preferred ranges in the removing solution composition are 99-50% of component 1, 1-20% of component 2 and no greater than 30% of component 3. Within these ranges, the cleaning performance of the removing solution for photosensitive composition of the invention for red photosensitive compositions is high and aggregation and precipitation of the red pigment is prevented.

When the removing solution for photosensitive composition of the invention containing component 1, component 2 and component 3 is used for removal of a green, blue or black photosensitive composition containing a phthalocyanine-based pigment such as C.I. Pigment Blue 15, 15:1, 15:4, 15:6, C.I. Pigment Green 36 or carbon black, an effect of improved removing performance will be exhibited if the content of component 2 is 5% or greater and the content of component 3 is up to 30% in the removing solution for photosensitive composition of the invention. That is, when a pigment-containing green, blue or black photosensitive composition is removed, ranges of 95-40% of component 1, 5-30% of component 2 and no greater than 30% of component 3 are preferred in order to exhibit a particularly notable effect of the removing solution composition of the invention and to prevent aggregation and precipitation of the pigments.

The following detailed explanation concerns a colored photosensitive resin composition for application of a removing solution of the invention.

The colored photosensitive composition for application of a removing solution of the invention is generally a pigment-containing colored photosensitive composition used in a process of forming the color filter for a liquid crystal device, an organic EL device, an image sensor or the like. Such colored photosensitive compositions are photosensitive compositions colored by addition of pigments, and generally they contain alkaline-developing film-forming substances, photosensitive substances, pigments and the like.

As film-forming substances to be included in the colored photosensitive composition there may be mentioned acrylic resins, novolac resins, polyimide resins and polyvinylphenol resins, but the invention is particularly suitable for removal of colored photosensitive compositions containing acrylic resins as film-forming substances. The acrylic resins used as film-forming substances are high-molecular polymers or copolymers with molecular weights of about 1000-500,000 which are alkali-soluble, and preferably are copolymers of carboxyl group-containing ethylenic unsaturated monomers and other ethylenic unsaturated monomers.

As photosensitive substances to be included in the colored photosensitive composition, when acrylic resins are used as film-forming substances, there may be mentioned hexaarylbiimidazole-based compounds, triazine-based compounds, aminoacetophenone-based compounds, combinations of sensitizing coloring matters and organic boron salt-based compounds, titanocene-based compounds, oxadiazole-based compounds and the like.

Pigments to be used in the colored photosensitive composition may be any pigments commonly used for manufacture of color filters, and these include black, yellow, red, blue and green colored organic or inorganic pigments, either alone or in any combinations thereof. As specific examples of pigments there may be mentioned carbon black, acetylene black, lamp black, carbon nanotubes, graphite, iron black, iron oxide black pigment, aniline black, cyanine black, titan black, C.I. Pigment Yellow 20, 24, 83, 86, 93, 109, 110, 117, 125, 137, 138, 139, 147, 148, 153, 154, 166, C.I. Pigment Orange 36, 43, 51, 55, 59, 61, C.I. Pigment Red 9, 97, 122, 123, 149, 168, 177, 180, 192, 215, 216, 217, 220, 223, 224, 226, 227, 228, 240, 254, C.I. Pigment Violet 19, 23, 29, 30, 37, 40, 50, C.I. Pigment Blue 15, 15:1, 15:4, 15:6, 22, 27, 60, 64, C.I. Pigment Green 7, 10, 36, 37 and C.I. Pigment Brown 23, 25, 26.

The colored photosensitive composition may also contain an ethylenic unsaturated monomer in addition to the aforementioned film-forming substances, photosensitive substances and pigments. An ethylenic unsaturated monomer is a compound that polymerizes by radicals generated from a photopolymerization initiator upon irradiation with active light rays.

A colored photosensitive composition for application to a removing solution of the invention may also contain other components as appropriate, such as organic solvents, pigment dispersing agents, adhesiveness enhancers, leveling agents, developing enhancers, antioxidants, thermal polymerization inhibitors and the like.

The removing solution for photosensitive composition of the invention may be applied for removal of colored photosensitive compositions that have been coated or attached onto articles to be cleaned, and is particularly suitable for removal of colored photosensitive compositions prior to exposure to light. The colored photosensitive composition may have the solvent contained therein or may have the solvent already removed by evaporation.

The method for removal of the colored photosensitive composition may be a method in which the cleaning solution is sprayed from a nozzle or the like in a stream, liquid droplet or mist fashion onto the article to be cleaned having the colored photosensitive composition coated or attached thereto, or a method in which an article to be cleaned having the colored photosensitive composition attached thereto is dipped in the removing solution of the invention. For more efficient removal, this may be combined with physical cleaning such as ultrasonic irradiation or brushing.

The removing solution of the invention may be suitably used for removal of undesirable portions of an uncured colored photosensitive composition attached on the periphery, edges or back side of a substrate in the step of coating the colored photosensitive composition during manufacture of a color filter used for a liquid crystal device, an organic EL device, an image sensor or the like, or for removal of undesirable portions of an uncured colored photosensitive composition attached to all or a portion of a coating apparatus.

The removing solution of the invention may also be suitably applied for removal of an uncured colored photosensitive composition on the periphery, edges or back side of a substrate or for cleaning removal of a colored photosensitive composition that has splashed out into a cup during spin coating, i.e. for cup rinsing, during coating of the colored photosensitive composition onto the substrate by spin coating, i.e. as a rinsing agent for edge rinsing or back rinsing.

Other known methods for applying colored photosensitive compositions onto substrates other than spin coating include slit coating, wire bar coating and roll coating, but the removing solution of the invention may also be suitably used for removal of uncured portions of a colored photosensitive composition attached to surfaces of coating apparatus members or equipments such as slit nozzles, wire bars and printing plates.

Another aspect of the invention relates to a substrate from which uncured portions of a photosensitive composition have been removed using the aforementioned removing solution by the methods described above, and to apparatuses used for manufacture of liquid crystal devices, organic EL devices, image sensors and the like, as well as color filters obtained from such apparatuses.

The present invention will now be explained in greater detail through the following examples, with the understanding that the invention is in no way limited by the examples.

The cleaning property was evaluated on the following 3-level scale, based on visual observation of the dissolved condition of the colored photosensitive composition after immersion in the removing solution for 3 minutes.

Good—Completely removed

Fair—Partially dissolved

Poor—Virtually no dissolution

PREPARATION EXAMPLE 1

Preparation of Acrylic Copolymer

In a four-necked flask equipped with a dropping funnel, thermometer, condensation tube and stirrer there were charged 12.0 parts by mass of methacrylic acid (MA), 14.0 parts by mass of methyl methacrylate (MMA), 43.0 parts by mass of n-butyl methacrylate (BMA), 6.0 parts by mass of 2-hydroxyethyl acrylate (HEMA) and 225.0 parts by mass of ethylcellosolve acetate (EGA), and the four-necked flask was filled with nitrogen for one hour. After heating to 90° C. with an oil bath, a mixture of 12.0 parts by mass of MA, 14.0 parts by mass of MMA, 43.0 parts by mass of BMA, 6.0 parts by mass of HEMA, 225.0 parts by mass of EGA and 3.2 parts by mass of 2,2'-azobisisobutyronitrile (AIBN) was added dropwise over a period of one hour. After subsequent polymerization for 3 hours, a mixture of 1.0 part by weight of AIBN and 15.0 parts by mass of EGA was added, and the mixture was heated to 100° C. for 1.5 hours of polymerization and then allowed to cool. The solid concentration of the acrylic copolymer obtained in this manner was 22.1 mass %, the acid value was 92 mgKOH/g and the mass weight-average molecular weight in terms of polystyrene as measured by GPC was 22,000.

PREPARATION EXAMPLE 2

Colored Photosensitive Composition

A: Preparation of Black Photosensitive Composition

After mixing 30.0 parts by mass of the acrylic copolymer obtained in Preparation Example 1 (solid portion: 6.6 parts by mass), 5.0 parts by mass of EGA, 3.3 parts by mass of FLOWLEN DOPA-33 (trademark of Kyoeisha Chemical Co., Ltd., dispersing agent with solid concentration of 30 mass %) and 6.6 parts by mass of Special Black 4 (Degussa Corp., carbon black), the mixture was allowed to stand overnight. It was then stirred for one hour and passed four times through a triple roll mill (Model RIII-1 RM-2 by Kodaira Seisakusho Co., Ltd.). EGA was added to the obtained black ink to adjust the concentration, in order to obtain a black composition with a solid concentration of 18.0 mass %.

To 100 parts by mass of the black composition obtained in this manner there were further added 4.4 parts by mass of dipentaerythritol hexaacrylate, 2.2 parts by mass of 2-(4-methoxyphenyl)-4,6-bis(trichloromethyl)-s-triazine and 25 parts by mass of EGA, and the mixture was thoroughly stirred to obtain colored photosensitive composition A.

PREPARATION EXAMPLE 3

Colored Photosensitive Composition

B: Preparation of Green Photosensitive Composition

After mixing 30.0 parts by mass of the acrylic copolymer obtained in Preparation Example 1 (solid portion: 6.6 parts by mass), 5.0 parts by mass of EGA, 3.3 parts by mass of FLOWLEN DOPA-33 (trademark of Kyoeisha Chemical Co., Ltd., dispersing agent with solid concentration of 30 mass %) and 6.6 parts by mass of Pigment Green 36, the mixture was allowed to stand overnight. It was then stirred for one hour and passed four times through a triple roll mill (Model RIII-1 RM-2 by Kodaira Seisakusho Co., Ltd.). EGA was added to the obtained green ink to adjust the concentration, in order to obtain a green composition with a solid concentration of 18.0 mass %.

To 100 parts by mass of the green composition obtained in this manner there were further added 4.4 parts by mass of dipentaerythritol hexaacrylate, 0.7 part by weight of 4,4'-bis(N,N-diethylamino)benzophenone, 2.3 parts by mass of 2,2'-bis(o-chlorophenyl)-4,4'-5,5'-tetraphenyl-1,2'-biimidazole, 3.8 parts by mass of trimethylolpropane tristhiopropionate and 42 parts by mass of EGA, and the mixture was thoroughly stirred to obtain colored photosensitive composition B.

PREPARATION EXAMPLE 4

Colored Photosensitive Composition

C: Preparation of Red Photosensitive Composition

After mixing 30.0 parts by mass of the acrylic copolymer obtained in Preparation Example 1 (solid portion: 6.6 parts by mass), 5.0 parts by mass of EGA, 3.3 parts by mass of FLOWLEN DOPA-33 (trademark of Kyoeisha Chemical Co., Ltd., dispersing agent with solid concentration of 30 mass %) and 6.6 parts by mass of Pigment Red 177, the mixture was allowed to stand overnight. It was then stirred for one hour and passed four times through a triple roll mill (Model RIII-1 RM-2 by Kodaira Seisakusho Co., Ltd.). EGA was added to the obtained red ink to adjust the concentration, in order to obtain a red composition with a solid concentration of 18.0 mass %. To 100 parts by mass of this colored composition there were further added 4.4 parts by mass of dipentaerythritol hexaacrylate, 3.0 parts by mass of Irgacure 369 (Ciba Specialty Chemicals), 3.8 parts by mass of trimethylolpropane tristhiopropionate and 42 parts by mass of EGA, and the mixture was thoroughly stirred to obtain colored photosensitive composition C.

EXAMPLE 1

One drop of each of the colored photosensitive compositions A-C prepared in Preparation Examples 2-4 was dropped onto a glass substrate (28 mm×76 mm) and allowed to dry at room temperature for 24 hours.

This was immersed and allowed to stand for 3 minutes in a removing solution comprising a mixture of 80 g of propylene glycol monomethyl ether acetate and 20 g of N,N-dimethylacetamide, for cleaning removal of the colored photosensitive composition coated on the surface. The results are shown in Table 1.

EXAMPLES 2-29, COMPARATIVE EXAMPLE 1-6

The colored photosensitive compositions were removed in the same manner as Example 1, using removing solutions having the compositions listed in Table 1. The results are also shown in Table 1.

TABLE 1

| | | Cleaning solution composition (mass %) | | | | | | | | | | | Cleaning property | | |
| | | Component 1 | | | | Component 2 | | | | Component 3 | | | Colored photosensitive composition | | |
| | | PMA | MBA | MMP | EEP | CYA | DMF | DMAC | NMP | DMSO | TMB | CUM | S-TM | A (Black) | B (Green) | C (red) |
| Example | 1 | 80 | | | | | | 20 | | | | | | good | good | good |
| | 2 | | 95 | | | | 5 | | | | | | | good | good | good |
| | 3 | 75 | 20 | | | 5 | | | | | | | | good | good | good |
| | 4 | 75 | | | 20 | 5 | | | | | | | | good | good | good |
| | 5 | 70 | | | | | 30 | | | | | | | good | good | fair |
| | 6 | 99 | | | | | 1 | | | | | | | fair | fair | good |
| | 7 | 97 | | | | | | 3 | | | | | | fair | fair | good |
| | 8 | | | 97 | | | | 3 | | | | | | fair | fair | good |
| | 9 | 65 | | | | | 15 | | | | | | 20 | good | good | good |

TABLE 1-continued

| | | Cleaning solution composition (mass %) | | | | | | | | | | | | Cleaning property | | |
|---|---|---|---|---|---|---|---|---|---|---|---|---|---|---|---|---|
| | | Component 1 | | | | Component 2 | | | | Component 3 | | | | Colored photosensitive composition | | |
| | | PMA | MBA | MMP | EEP | CYA | DMF | DMAC | NMP | DMSO | TMB | CUM | S-TM | A (Black) | B (Green) | C (red) |
| | 10 | 70 | | | | | 10 | | | | | | 20 | good | good | good |
| | 11 | 60 | | | | | | 10 | | | | | 30 | good | good | good |
| | 12 | 65 | | | | | | 5 | | | | | 30 | good | good | good |
| | 13 | 65 | | | | | | | 5 | | | | 30 | good | good | good |
| | 14 | 65 | | | | | | | | 5 | | | 30 | good | good | good |
| | 15 | 85 | | | | | 5 | | | | 10 | | | good | good | good |
| | 16 | 65 | | | | | 5 | | | | 30 | | | good | good | good |
| | 17 | 45 | | | | | 5 | | | | 50 | | | good | good | good |
| | 18 | 69 | | | | | 1 | | | | | | 30 | fair | fair | good |
| | 19 | 69 | | | | | | 1 | | | | | 30 | fair | good | good |
| | 20 | 69 | | | | | | | | 1 | | | 30 | fair | fair | good |
| | 21 | 87 | | | | | 3 | | | | 10 | | | fair | fair | good |
| | 22 | 67 | | | | | 3 | | | | 30 | | | fair | fair | good |
| | 23 | 67 | | | | | 3 | | | | | 30 | | fair | fair | good |
| | 24 | 47 | | | | | 3 | | | | 50 | | | fair | fair | good |
| | 25 | | 80 | | | 20 | | | | | | | 20 | good | good | good |
| | 26 | | 70 | | | 20 | | | | | | | 10 | good | good | good |
| | 27 | | 90 | | | | 5 | | | 5 | | | | good | good | good |
| | 28 | | | 65 | 10 | | | | | | | | 25 | good | good | good |
| | 29 | | | 77 | | | 3 | | | | | | 20 | fair | fair | good |
| Comp. | 1 | 100 | | | | | | | | | | | | poor | fair | fair |
| Ex. | 2 | | 100 | | | | | | | | | | | poor | fair | fair |
| | 3 | | | 100 | | | | | | | | | | fair | fair | poor |
| | 4 | | | | | 100 | | | | | | | | poor | poor | poor |
| | 5 | | | | | | | | | | 100 | | | poor | poor | poor |
| | 6 | | | | | | | | | | | 100 | | poor | poor | poor |

Explanation of symbols
PMA Propylene glycol monomethyl ether acetate
MBA 3-Methoxybutyl acetate
MMP Methyl 3-methoxypropionate
EEP Ethyl 3-ethoxypropionate
CYA Cyclohexanone
DMF N,N-Dimethylformamide
DMAC N,N-Dimethylacetamide
NMP N-Methylpyrrolidone
TMB 1,2,4-Trimethylbenzene
CUM Cumene
S-TM Solfine-TM (Showa Denko K.K.)

INDUSTRIAL APPLICABILITY

The present invention provides a removing solution for photosensitive composition that is useful for removal of a residual pigment-containing photosensitive composition film coated on the periphery, edges or back side of a substrate during the step of forming a photosensitive composition film in the manufacture of a liquid crystal device, an organic EL device, an image sensor or the like, or for removal of a pigment-containing photosensitive composition attached to the surface of an apparatus member or an equipment.

The invention claimed is:

1. A removing solution for photosensitive composition which is a removing solution for a colored photosensitive composition containing a pigment, comprising
   (1) 99-70 mass % of at least one solvent selected from the group consisting of alkylene glycol monoalkyl ether carboxylic acid esters, alkoxycarboxylic acid esters and alicyclic ketones, and
   (2) 1-30 mass % of at least one solvent selected from the group consisting of linear amides, cyclic amides, sulfur-containing compounds and cyclic esters.

2. A removing solution for photosensitive composition which is a removing solution for a colored photosensitive composition containing a pigment, comprising
   (1) 98-40 mass % of at least one solvent selected from the group consisting of alkylene glycol monoalkyl ether carboxylic acid esters, alkoxycarboxylic acid esters and alicyclic ketones,
   (2) 1-30 mass % of at least one solvent selected from the group consisting of linear amides, cyclic amides, sulfur-containing compounds and cyclic esters, and
   (3) up to 50 mass % of an aromatic hydrocarbon having 9 or more carbon atoms.

3. A removing solution for photosensitive composition which is a removing solution for a red photosensitive composition containing a pigment, comprising
   (1) 99-80 mass % of at least one solvent selected from the group consisting of alkylene glycol monoalkyl ether carboxylic acid esters, alkoxycarboxylic acid esters and alicyclic ketones, and
   (2) 1-20 mass % of at least one solvent selected from the group consisting of linear amides, cyclic amides, sulfur-containing compounds and cyclic esters.

4. A removing solution for photosensitive composition which is a removing solution for a red photosensitive composition containing a pigment, comprising
   (1) 98-50 mass % of at least one solvent selected from the group consisting of alkylene glycol monoalkyl ether carboxylic acid esters, alkoxycarboxylic acid esters and alicyclic ketones, (2) 1-20 mass % of at least one solvent selected from the group consisting of linear amides, cyclic amides, sulfur-containing compounds and cyclic esters, and
(3) up to 30 mass % of an aromatic hydrocarbon having 9 or more carbon atoms.

5. A removing solution for photosensitive composition which is a removing solution for a green, blue or black photosensitive composition containing a pigment, comprising
(1) 95-70 mass % of at least one solvent selected from the group consisting of alkylene glycol monoalkyl ether carboxylic acid esters, alkoxycarboxylic acid esters and alicyclic ketones, and
(2) 5-30 mass % of at least one solvent selected from the group consisting of linear amides, cyclic amides, sulfur-containing compounds and cyclic esters.

6. A removing solution for photosensitive composition which is a removing solution for a green, blue or black photosensitive composition containing a pigment, comprising
(1) 94-40 mass % of at least one solvent selected from the group consisting of alkylene glycol monoalkyl ether carboxylic acid esters, alkoxycarboxylic acid esters and alicyclic ketones,
(2) 5-30 mass % of at least one solvent selected from the group consisting of linear amides, cyclic amides, sulfur-containing compounds and cyclic esters, and
(3) up to 30 mass % of an aromatic hydrocarbon having 9 or more carbon atoms.

7. A removing solution for photosensitive composition according to claim 2, wherein the aromatic hydrocarbon having 9 or more carbon atoms is an alkylbenzene with a boiling point of 150-250° C.

8. A removing solution for photosensitive composition according to claim 1, wherein at least one solvent selected from the group consisting of linear amides, cyclic amides, sulfur-containing compounds and cyclic esters is at least one compound selected from the group consisting of N,N-dimethylformamide, N,N-dimethylacetamide, N-methylpyrrolidone, dimethylsulfoxide and γ-butyrolactone.

9. A removing solution for photosensitive composition according to claim 1, wherein the alkylene glycol monoalkyl ether carboxylic acid ester is at least one compound selected from the group consisting of propylene glycol monomethyl ether acetate and 3-methoxybutyl acetate.

10. A removing solution for photosensitive composition according to claim 1, wherein the alkoxycarboxylic acid ester is at least one compound selected from the group consisting of methyl 3-methoxypropionate and ethyl 3-ethoxypropionate.

11. A removing solution for photosensitive composition according to claim 1, wherein the alicyclic ketone is at least one compound selected from the group consisting of cyclohexanone, cyclopentanone and methylcyclohexanone.

12. A removing solution for photosensitive composition according to claim 1, which is used for removal of an acrylic photosensitive composition containing a colored pigment.

13. A removing solution for photosensitive composition according to claim 1, which is used for removal of a photosensitive composition containing a pigment prior to exposure to light.

14. An apparatus in which a photosensitive composition containing a colored pigment is removed using a removing solution for photosensitive composition according to claim 1.

15. A color filter obtained by an apparatus according to claim 14.

16. A device equipped with a color filter according to claim 15.

17. A substrate that has been treated for removal of a photosensitive composition containing a colored pigment using a removing solution for photosensitive composition according to claim 1.

* * * * *